June 3, 1969 K. RAITHEL 3,448,051
METHOD OF INSERTING MANGANESE INTO SEMICONDUCTORS SERVING TO PRODUCE ELECTRONIC SEMICONDUCTOR STRUCTURAL COMPONENTS
Filed Nov. 8, 1966
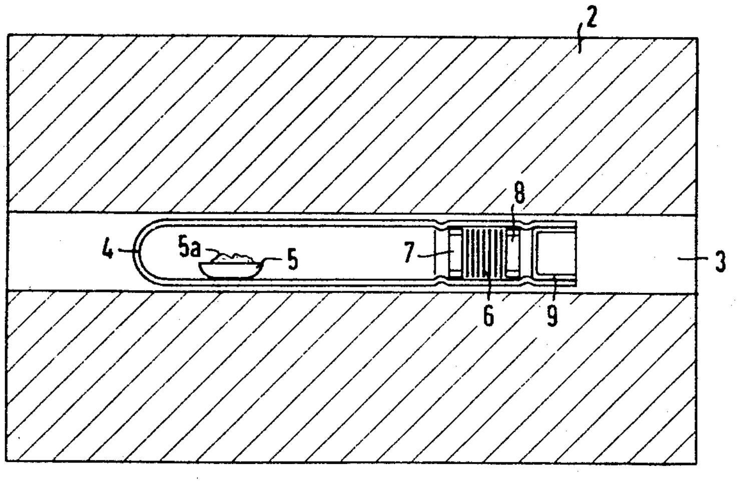

United States Patent Office 3,448,051
Patented June 3, 1969

3,448,051

METHOD OF INSERTING MANGANESE INTO SEMICONDUCTORS SERVING TO PRODUCE ELECTRONIC SEMICONDUCTOR STRUCTURAL COMPONENTS

Kurt Raithel, Uttenreuth, Germany, assignor to Siemens Aktiengesellschaft, a corporation of Germany Filed Nov. 8, 1966, Ser. No. 592,934
Claims priority, application Germany, Nov. 11, 1965, S 100,447
Int. Cl. H01l 7/00, 3/00
U.S. Cl. 252—62.3 3 Claims

ABSTRACT OF THE DISCLOSURE

A method for introducing recombination centers into a semiconductive body by heating the semiconductive body in the presence of a vaporized manganese oxide.

It may be favorable to introduce recombination centers into semiconductor bodies when producing semiconductor components, particularly thyristors. Thus, short free periods may be produced in thyristors by inserting recombination centers, into the semiconductor bodies. The free period of a thyristor is the period during which the full blocking voltage can be reapplied in forward direction (saw-tooth voltage) after the thyristor is extinguished, i.e. after the latter has become impermeable, without the thyristor starting to fire in its own, i.e. become permeable. This free period depends essentially upon the thyristor characteristics in the region of the center p-n junction in the semiconductor body. If there are sufficient recombination centers in this region for the recombination of the load carrier pairs after the current stops flowing, then the full blocking capacity of said p-n junction may be reestablished within a short period.

It was found particularly advantageous to introduce or insert manganese as recombination centers into the semiconductor bodies. Manganese is relatively inexpensive compared to other heavy metals which are suitable as recombination centers. Furthermore, the thyristor produced with recombination centers consisting of manganese atoms have a hard "characteristic line." Thyristors possessing the "hard characteristic line" have sharply defined break-through voltages in the blocking, as well as in the forward direction. Their blocking currents are constant and of an order of magnitude of one to two mA, in blocking as well as in forward direction, provided the voltage applied to the thyristor does not exceed the break-through voltage in either the blocking or forward direction.

In conventional semiconductor material, particularly in silicon, manganese possesses a solubility which is very dependent on the temperature, decreasing with a temperature drop. As a result, the largest portion of the manganese indiffused into the semiconductor in an atomsphere of pure manganese vapor reprecipitates from the semiconductor material when the semiconductor is being cooled to room temperature. This reprecipitation deposits upon the surface of the semiconductor, creating a difficulty in introducing a sufficient concentration of manganese atoms in the semiconductor bodies where they are to act as recombination centers.

The present invention has as an object the elimination of these difficulties. The invention thus relates to a method of introducing manganese into semiconductor bodies, particularly silicon, which are used in the production of electronic semiconductor components. According to my invention, the heated semiconductor bodies are exposed to the vapors of a manganese oxide, preferably $Mn_2O_7$, $MnO$, $MnO_2$, $Mn_2O_3$ and/or $Mn_3O_4$ vapors.

The figure shows a device for executing the method according to the invention.

The invention will be described in greater detail using an embodiment utilizing the device of the drawing.

A diffusion furnace 2 has a tubular opening 3, open on both ends. The furnace is surrounded by an electric resistance coil (not shown) for heating said furnace. An evacuated quartz ampulla 4 vacuum tightly fused is positioned in the tubular opening 3. At one of its ends, this quartz ampulla 4 contains a quartz boat 5 which may be filled with a pulverized manganese oxide compound 5*a*. This may be, for example, manganese monoxide ($MnO$), manganese dioxide ($MnO_2$), braunite ($Mn_2O_3$) and/or hausmannite ($Mn_3O_4$). At the other end of the quartz ampulla 4 are silicon discs 6. These are held in place by tube pieces 7 and 8 made, for example, of quartz. A quartz piece 9 with an approximately U-shaped longitudinal section is pushed into the opening of the quartz ampulla, and fused together with the opening by means of a gas or bunsen burner.

According to the method of my invention, the quartz ampulla 4, the boat 5 with the manganese oxide $MnO_2$, 5*a* and the silicon discs 6 are kept in furnace 2 for a period from one half hour to two hours, at a temperature from 900° to 1000° C. The preferred conditions were 960° C. for one hour. Thus the silicon discs 6 exposed to the vapors of the manganesee oxide contain a sufficient concentration of manganese atoms, even after being cooled down to room temperature.

During the production of a thyristor it is desirable to insert first the doping material into the semiconductor body, by means of a special diffusion process, and subseqeuntly to indiffuse manganese in another diffusion vessel, according to my invention.

Obviously many modifications and variations of the present invention are possible in the light of the above teachings. It is therefore to be understood that within the scope of the appended claims, the invention may be practiced otherwise than as specifically described.

I claim:

1. The method of introducing manganese into semiconductor bodies serving in the production of electronic semiconductor components, which comprises exposing heated semiconductor bodies to the vapors of a manganese oxide.

2. The method of claim 1 wherein the semiconductor bodies together with an open vessel containing the manganese oxide are maintained in an evacuated, vacuum-tightly fused ampoule for a period from one-half hour to two hours, at a temperature from 900° to 1000° C.

3. The method of claim 2, wherein the semiconductor bodies are silicon and the bodies are maintained at 960° C. for about one hour together with vaporized manganese oxide.

References Cited

UNITED STATES PATENTS

| | | | |
|---|---|---|---|
| 3,108,914 | 10/1963 | Hoerni | 148—186 |
| 3,109,760 | 11/1963 | Goetzberger | 148—186 |

L. DEWAYNE RUTLEDGE, *Primary Examiner.*
R. A. LESTER, *Assistant Examiner.*

U.S. Cl. X.R.

117—201; 148—1.5, 186, 188, 189, 190